United States Patent
Lecamp et al.

(10) Patent No.: US 9,412,958 B2
(45) Date of Patent: Aug. 9, 2016

(54) TRANSPARENT DIFFUSIVE OLED SUBSTRATE AND METHOD FOR PRODUCING SUCH A SUBSTRATE

(71) Applicant: SAINT-GOBAIN GLASS FRANCE, Courbevoie (FR)

(72) Inventors: Guillaume Lecamp, Paris (FR); Vincent Sauvinet, Grenoble (FR); Young Seong Lee, Seoul (KR)

(73) Assignee: SAINT-GOBAIN GLASS FRANCE, Courbevoie (FR)

(*) Notice: Subject to any disclaimer, the term of this patent is extended or adjusted under 35 U.S.C. 154(b) by 0 days.

(21) Appl. No.: 14/897,781

(22) PCT Filed: Jun. 13, 2014

(86) PCT No.: PCT/EP2014/062452
§ 371 (c)(1),
(2) Date: Dec. 11, 2015

(87) PCT Pub. No.: WO2014/198938
PCT Pub. Date: Dec. 18, 2014

(65) Prior Publication Data
US 2016/0126481 A1 May 5, 2016

(30) Foreign Application Priority Data
Jun. 14, 2013 (EP) .................................. 13172085

(51) Int. Cl.
*H01L 51/52* (2006.01)
*H01L 51/00* (2006.01)
(Continued)

(52) U.S. Cl.
CPC ............ *H01L 51/0096* (2013.01); *C03C 3/066* (2013.01); *C03C 8/16* (2013.01);
(Continued)

(58) Field of Classification Search
CPC . H01L 51/5268; H01L 51/0096; H01L 51/56; C03C 17/007; C03C 17/3417; C03C 3/066; C03C 8/16; C03C 2205/00; C03C 2217/452; C03C 2217/475; Y02E 10/549
See application file for complete search history.

(56) References Cited

U.S. PATENT DOCUMENTS 7,851,995 B2 * 12/2010 Tyan .................... C03C 17/38
313/498
2007/0267966 A1 11/2007 Numajiri et al.
(Continued)

FOREIGN PATENT DOCUMENTS

EP 2 490 506 A1 8/2012
EP 2 660 891 A2 11/2013
(Continued)

OTHER PUBLICATIONS

Machine translation of JP2005353367. Retrieved Apr. 16, 2016.*
(Continued)

*Primary Examiner* — Prashant J Khatri
(74) *Attorney, Agent, or Firm* — Pillsbury Winthrop Shaw Pittman LLP

(57) ABSTRACT

A transparent diffusive OLED substrate includes the following successive elements or layers: (a) a transparent flat substrate made of mineral glass having a refractive index n1 of between 1.48 and 1.58, (b) a monolayer of mineral particles attached to one side of the substrate by means of a low index mineral binder having a refractive index n2 of between 1.45 and 1.61, and (c) a high index layer made of an enamel having a refractive index n4 between 1.82 and 2.10 covering the monolayer of mineral particles, the mineral particles having a refractive index n3 between n2+0.08 and n4−0.08 and protruding from the low index mineral binder so as to be directly in contact with the high index layer, thereby forming a first diffusive interface between the mineral particles and the low index binder, and a second diffusive interface between the mineral particles and the high index layer.

22 Claims, 3 Drawing Sheets

(51) Int. Cl.
    *H01L 51/56*     (2006.01)
    *C03C 17/00*     (2006.01)
    *C03C 8/16*     (2006.01)
    *C03C 3/066*     (2006.01)
    *C03C 17/34*     (2006.01)

(52) U.S. Cl.
    CPC .......... *C03C 17/007* (2013.01); *C03C 17/3417* (2013.01); *H01L 51/5268* (2013.01); *H01L 51/56* (2013.01); *C03C 2205/00* (2013.01); *C03C 2217/452* (2013.01); *C03C 2217/475* (2013.01); *H01L 2251/305* (2013.01); *H01L 2251/558* (2013.01); *Y02E 10/549* (2013.01)

(56) References Cited

U.S. PATENT DOCUMENTS

2010/0150513 A1*   6/2010   Zhang .................... B82Y 20/00
                                                                       385/131

2011/0278635 A1*  11/2011   Nakamura ................ C03C 3/21
                                                                        257/99

FOREIGN PATENT DOCUMENTS

| EP | 2 712 851 A1 | 4/2014 |
| EP | 2 803 644 A1 | 11/2014 |
| EP | 2 803 645 A1 | 11/2014 |
| JP | 2005-353367 A | 12/2005 |
| WO | WO 2011/089343 A1 | 7/2011 |
| WO | WO 2012/091415 A2 | 7/2012 |

OTHER PUBLICATIONS

International Search Report as issued in International Patent Application No. PCT/EP2014/062452, dated Nov. 18, 2014.

International Preliminary Report on Patentability and the Written Opinion of the International Searching Authority as issued in International Patent Application No. PCT/EP2014/062452, dated Dec. 15, 2015.

* cited by examiner

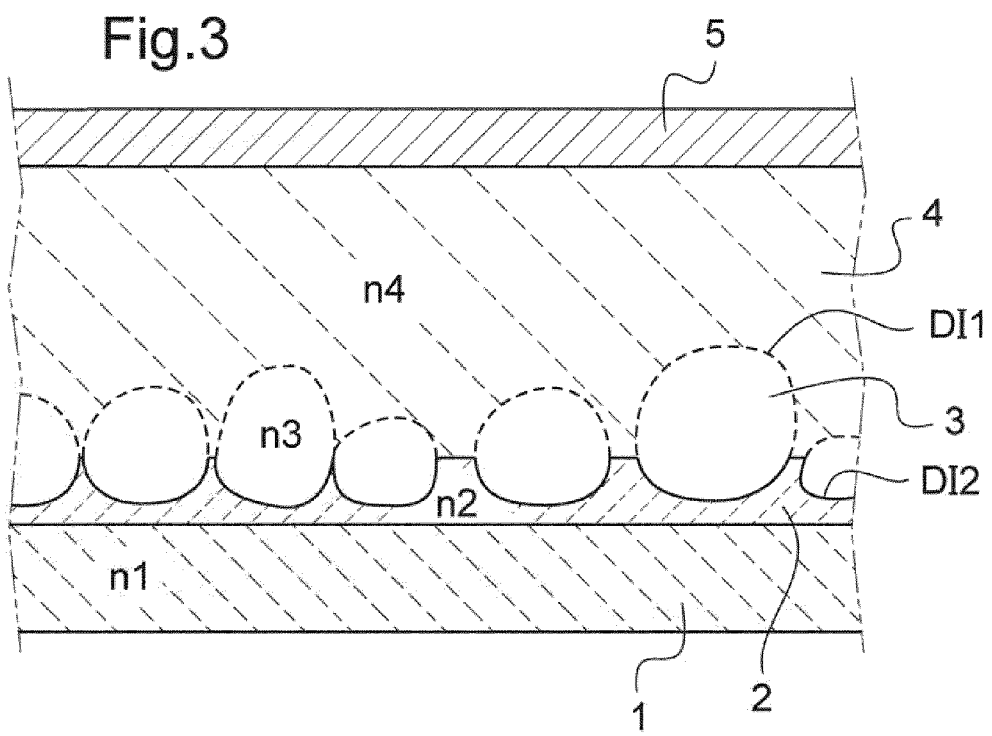

TRANSPARENT DIFFUSIVE OLED SUBSTRATE AND METHOD FOR PRODUCING SUCH A SUBSTRATE

CROSS REFERENCE TO RELATED APPLICATIONS

This application is the U.S. National Stage of PCT/EP2014/062452, filed Jun. 13, 2014, which in turn claims priority to French patent application number 13172085.6 filed Jun. 14, 2013. The content of these applications are incorporated herein by reference in their entireties.

The present invention is drawn to a diffusive substrate for organic light emitting diodes (OLED) having better light extraction performances, and to methods for producing such a substrate.

OLEDs are opto-electronic elements comprising a stack of organic layers with fluorescent or phosphorescent dyes sandwiched between two electrodes, at least one of which is translucent. When a voltage is applied to the electrodes the electrons injected from the cathode and the holes injected from the anode combine within the organic layers, resulting in light emission from the fluorescent/phosphorescent layers.

It is commonly known that light extraction from conventional OLEDs is rather poor, most of the light being trapped by total internal reflection and is absorption in the high index organic layers and transparent conductive layers (TCL). Total internal reflection takes place not only at the boundary between the high index TCL and the underlying glass substrate (refractive index of about 1.5) but also at the boundary between the glass and the air.

According to estimates, in conventional OLEDs not comprising any additional extraction layer about 50-60% of the light emitted from the organic layers is trapped at the TCL/glass boundary, an additional 20-30% fraction is trapped at the glass/air surface and only about 20% exit the OLED into air.

It is known to reduce this light entrapment by inserting a light scattering means—often called internal extraction layer—between the high index TCL and the low index glass substrate. The most commonly used internal extraction layers have a high refractive index close to the TCL index and contain a plurality of light diffusing elements such as air bubbles or low index particles dispersed therein.

It is also known to increase out-coupling of light by simply texturing the interface between the glass and the high index layers, i.e. TCL and organic stack of the OLED. This can be obtained by first creating a suitable roughness at the glass substrate's surface and then planarizing the resulting roughness profile with a high index planarization layer before coating the TCL.

The applicant has already provided different methods for creating a suitable surface roughness on glass substrates for OLEDs:

WO2011/089343 discloses OLED substrates comprising at least one textured surface planarized with a high index glass coating. The substrates are described as being texturized by acid etching.

European application 12306179.8 filed on Sep. 28, 2012 describes an interesting alternative method for roughening one or both sides of the glass substrate, comprising mechanical roughening (lapping), European applications 13168335 and 13168341 filed on 17 May 2013 disclose methods for bonding low index mineral particles by means of a low index mineral binder to the glass substrate, thereby creating a rough surface which is then planarized with a high index enamel.

It can be shown that, to be most effective, an interface between the low index substrate and the high index layers of an OLED should have a roughness with rather steep slopes.

It is well known that, according to the Snell law, a high difference between the refractive indexes of the two mediums implies an undesirably low critical angle ($\theta_c$):

$$\theta_c = \arcsin(n_a/n_b)$$

where $n_a$ is the refractive index of the low index medium and $n_b$ the refractive index of the high index medium.

The critical angle of the interface between a planarization layer with a refractive index $n_b$ of 1.9 on a glass substrate having a refractive index $n_a$ of 1.5 is about 52°.

FIG. 1 shows that—in a 2D model where the surface roughness is formed by pyramids—the minimum slope ($\alpha$) of the pyramids to make sure that a light ray penetrates from the high index medium into the low index medium at first incidence is $\alpha = \pi/2 - \theta_c$. In other words, when $\theta_c$ is 52°, the pyramids should have a slope of at least 38°.

Unfortunately it has turned out to be very difficult or even impossible to prepare glass substrates with a surface roughness having a mean slope above 20° by conventional roughening methods such as etching, sandblasting or lapping.

FIG. 2a shows a SEM image and the slope distribution of an acid-etched glass substrate (Satinovo®) such as described in WO2011/089343; FIG. 2b shows a SEM image and the slope distribution of a substrate obtained by lapping such as described in EP application n° 12306179.8; and FIG. 2c shows a SEM image and the slope distribution of a glass substrate first sandblasted and then slightly acid-etched. In all three samples the median slope value is well below 20° and the ratio of slopes over 38° is near zero. This means that only very few light rays enter the low index glass phase at first incidence.

It is therefore desirable to prepare substrates for OLEDs with interfaces having either larger $\theta_c$ values (i.e. higher $n_a/n_b$ ratios) or steeper slopes in order to allow a higher fraction of light rays to penetrate into the low index substrate at first incidence.

The idea underlying the present invention is to increase the $\theta_c$ and to decrease the corresponding required minimum slopes by splitting the interface into two interfaces. As a matter of fact, it is easy to calculate that if an additional layer with intermediate refractive index ($n_{intermediate}=1.7$) could be inserted between the high index planarization layer ($n_b=1.9$) and the low index glass substrate ($n_a=1.5$), this would create two interfaces with a critical angle $\theta_c$ of about 63° and require minimum slopes of only 27° instead of 38°.

In the present invention the applicant provides a very simple way of inserting a mineral layer having an intermediate refractive index (hereafter referred to as "intermediate layer") between the low index substrate and the high index planarization layer.

The intermediate layer of the present invention is a densely packed monolayer of mineral particles having a refractive index which is intermediate between the high index of the planarization layer and the low index of the substrate, said monolayer of particles being bonded to the glass substrate by a low index mineral binder. In order to make sure that this intermediate particle layer is in contact both with the high index planarization layer and the low index layer, the low index mineral binder of course must not cover the particles and the particles must protrude from the mineral binder so as to be in contact with the high index layer. Selecting mineral particles to form the intermediate layer has the additional advantage of not requiring any additional roughening step because the two resulting interfaces are naturally diffusive, as can be seen on FIG. 3.

In a first aspect, the present invention is thus drawn to a transparent diffusive OLED substrate comprising the following successive elements or layers:
(a) a transparent flat substrate made of mineral glass having a refractive index $n_1$ of between 1.48 and 1.58,
(b) a monolayer of mineral particles attached to one side of the substrate by means of a low index mineral binder having a refractive index $n_2$ of between 1.45 and 1.61, and
(c) a high index layer made of an enamel having a refractive index $n_4$ comprised between 1.82 and 2.10 covering the monolayer of mineral particles, the mineral particles having a refractive index $n_3$ comprised between $n_2+0.08$ and $n_4-0.08$, preferably between $n_2+0.10$ and $n_4-0.10$, and protruding from the low index mineral binder so as to be directly in contact with the high index layer, thereby forming a first diffusive interface ($Di_1$) between the mineral particles and the low index binder, and a second diffusive interface ($Di_2$) between the mineral particles and the high index layer.

The present invention also provides two methods for preparing a diffusive substrate as defined above. These methods have in common the steps necessary for forming the high index enamel layer (c), and differ from each other essentially by the way of bonding the particle monolayer (b) to the substrate (a). Both methods will be described in more detail hereafter.

BRIEF DESCRIPTION OF THE DRAWINGS

FIG. 3 is a schematic sectional view of an OLED substrate according to an embodiment of the present invention.

Figure 1:
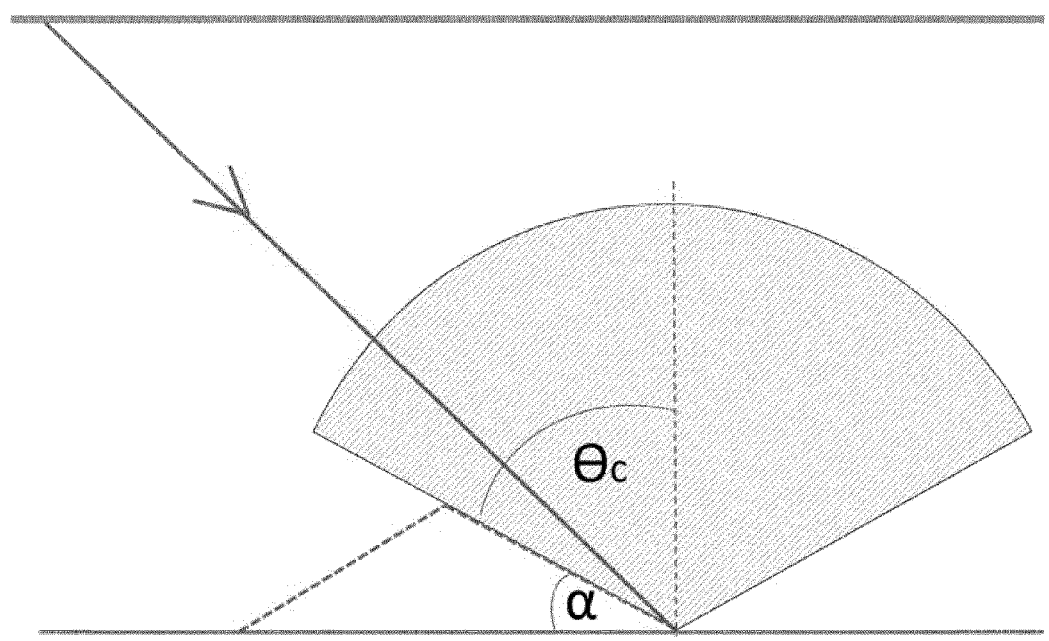
FIG. 1 shows a light ray that propagates toward a surface having a roughness formed by pyramids having a slope ($\alpha$)
Figure 2A:
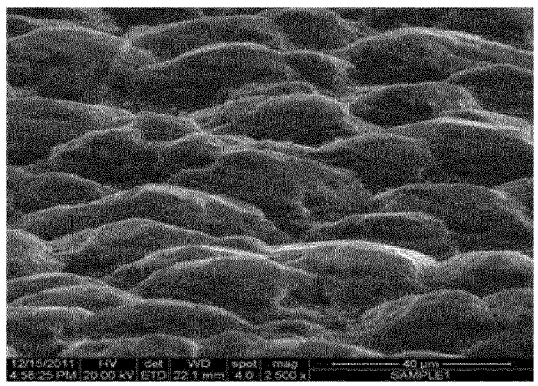
FIG. 2a shows a SEM image and the slope distribution of an acid-etched glass substrate.
Figure 2A:
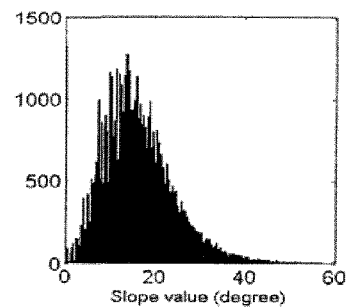
Figure 2B:
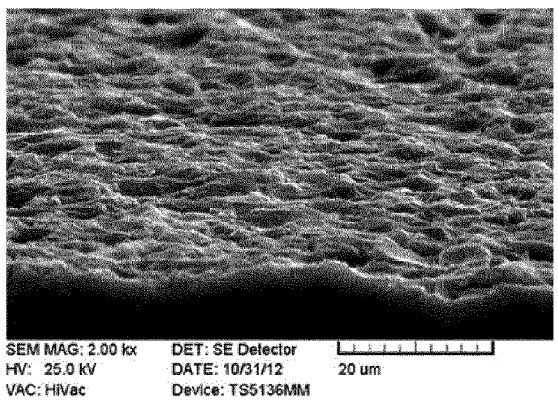
FIG. 2b shows a SEM image and the slope distribution of a substrate obtained by lapping.
Figure 2B:
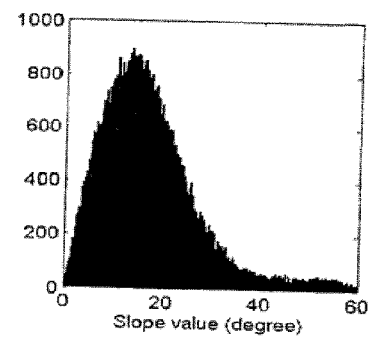
Figure 2C:
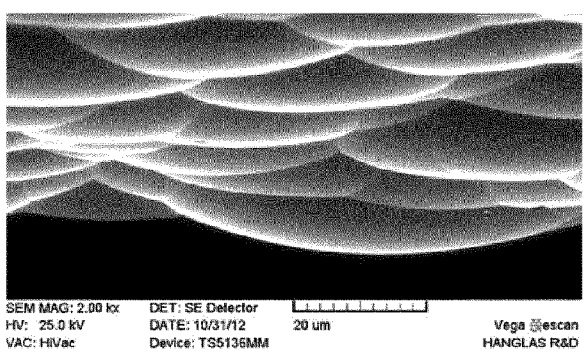
FIG. 2c shows a SEM image and the slope distribution of a glass substrate first sandblasted and then slightly acid-etched.
Figure 2C:
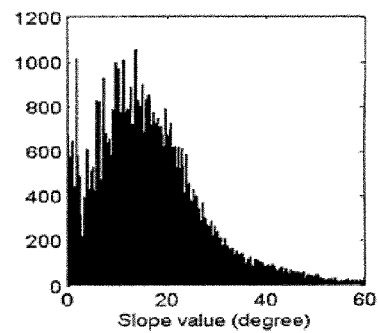

In the present application, the refraction index of the substrate, mineral binder, particles and planarization layer is meant to refer to the refraction index measured at 550 nm, unless specified otherwise.

The flat mineral glass substrate generally has a thickness of between 0.1 and 5 mm, preferably of between 0.3 and 1.6 mm. Its light transmittance is advantageously as high as possible, preferably comprised between 88% and 93%.

The glass substrate and the mineral binder used in the present invention have about the same refractive index, comprised preferably to between 1.50 and 1.56 for the glass substrate ($n_1$), and between 1.47 and 1.59 for the mineral binder ($n_2$). The difference of refractive index between the mineral binder and the glass substrate preferably is not higher than 0.05, preferably at most 0.03.

For the reasons explained above the mineral particles necessarily protrude from the mineral binder. They must not be substantially embedded therein. Protrusion of the particles from the binder layer can be achieved by selecting a suitable amount of mineral binder—low enough to not completely cover the particles—and by making sure that during the step of bonding the particles to the substrate by means of the mineral binder, the viscosity of the liquid binder, whether sol or fused glass frit, is low enough to allow the binder to flow between the particles and to spread on the underlying glass substrate, leaving the upper part of the particles exposed to atmosphere.

The mineral particles used in the present invention may be crystalline, amorphous or semi-crystalline particles. They may have a random shape with more or less sharp edges but preferably are rather spherical particles free of sharp edges.

In a preferred embodiment, the mineral particles are solid beads. Such beads are preferred over randomly-shaped sharp-edged particles because they easily spread over the substrate's surface thereby facilitating formation of a thin monolayer of beads, rather than large sized aggregates. Sphere-like particles devoid of sharp edges are also more easily planarized than randomly shaped particles. It is to be understood that hollow beads are not encompassed in the definition of mineral particles of the present invention, because the gas contained therein has a refractive index not comprised between $n_2+0.08$ and $n_4-0.08$.

The term "mineral particle", especially when used to describe the method of the present invention, encompasses particles functionalized with organic surface groups, such as trialkylsilyl groups. Said organic surface groups undergo thermal decomposition during the firing or fusing step of the mineral binder or, at the latest, during the formation of the high index enamel layer.

The mineral particles used in the present invention, whether spherical or not, have an average equivalent spherical diameter (measured by dynamic light scattering) of between 0.3 μm and 10 μm, preferably of between 0.5 μm and 8 μm, more preferably of between 0.8 μm and 7 μm, the equivalent spherical diameter of the irregularly shaped particles being defined as the diameter of the sphere having the same volume as the is mineral particle.

The average equivalent spherical diameter however is not the only size parameter to consider for selecting the mineral particles to be used in the present invention. Advantageously, the mineral particles are essentially free of large-sized particles, which would protrude not only from the mineral binder but also from the high index planarization layer and would then lead to current leakage in the final OLED. The mineral particles used in the present invention consequently are preferably essentially devoid of particles having an equivalent spherical diameter higher than 15 μm, preferably higher than 12 μm.

In a preferred embodiment of the present invention, the mineral particles have a refractive index (at 550 nm) comprised between 1.67 and 1.79, preferably between 1.70 and 1.76, and are selected for example from particles made predominantly, i.e. at least 90%, of alumina ($Al_2O_3$).

To achieve high light extraction efficiency it is important to form a highly packed monolayer of mineral particles having an intermediate refractive index. In the present invention a monolayer of particles is defined as a layer having an average thickness less than the average equivalent spherical diameter of the mineral particles, the average thickness of the particle layer being the total volume of the particles divided by the surface area of the zone coated with particles.

A highly packed layer means that the particles are close to each other or in contact with one another and that there is very little surface area of the coated region not covered by the particles. In the present invention preferably less than 45%, more preferably less than 30% and more preferably less than 20% of the coated zone are not covered by mineral particles. In this surface area between particles, the low index mineral binder is in contact with the high index planarization layer and the interface is not split in two interfaces.

In order to obtain a highly packed monolayer it is important to carefully select the amount of mineral particles per surface area. This amount is generally comprised between 2 g/m² and 20 g/m².

To make sure that in the final product, the mineral particles are not embedded in the low index mineral binder and significantly protrude therefrom, it is necessary to carefully select the amount of mineral binder with respect to the amount of mineral particles. If one uses too high amounts of mineral binder, the mineral particles will not be in contact with the high index planarization layer. On the other hand, in case the amount of mineral binder is too low with respect to the mineral particles, the bonding strength of the mineral binder is too weak and the resulting mineral layer will be excessively brittle and easily damaged when handled.

The applicant found that the volume ratio of the mineral particles to the mineral binder should advantageously be comprised between 0.4 and 5, preferably between 0.6 and 4 and more preferably between 0.9 and 3.0. The weight ratio of the mineral particles to the glass frit or to the dry matter of the sol is comprised between 0.5 and 8, preferably between 1 and 5.

The high index enamel (c) should be thick enough to completely cover and planarize the roughness profile of the monolayer of mineral particles (b).

The thickness of the high index layer (c) is advantageously comprised between 3 μm and 20 μm, preferably between 4 μm and 15 μm and more preferably between 5 μm and 12 μm. The thickness of the high index layer is defined here as the mean distance between the mean lines (defined as in ISO 4287, 3.1.8.1) of the roughness profile of the monolayer of particles protruding from the low index mineral binder and the roughness profile of the final high index layer.

The surface roughness of the final high index layer should be preferably as low as possible and the high index enamel advantageously has an arithmetical mean deviation $R_a$ of less than 3 nm, more preferably less than 2 nm and most preferably less than 1 nm.

The high index layer is preferably essentially free of diffusive elements dispersed therein, especially free of diffusive solid particles dispersed therein. As a matter of fact such solid diffusive particles could undesirably protrude from the surface of the high index layer and cause leakage currents in the final OLED.

As explained above, by inserting the intermediate layer between the low index mineral binder and the high index planarization layer the original non diffusive interface is split into two diffusive interfaces each having a roughness profile as depicted on FIG. 3.

The roughness profile of the first ($DI_1$) and second ($Di_2$) diffusive interfaces independently has an arithmetical mean deviation $R_a$ of between 0.1 and 5 μm, preferably of between 0.2 and 4 μm, more preferably of between 0.3 and 3 μm. The arithmetical mean deviation $R_a$ is defined in ISO 4287. It may be measured on the end product by scanning electron microscopy (SEM) of cross sections of the sample drawing a profile using image analysis, or before planarization, either by surface profile measurement or 3D laser microscopy for the first interface between planarization layer and binding layer with particles.

In a preferred embodiment, the transparent diffusive OLED substrate of the present invention further comprises a transparent electro-conductive layer (d) directly in contact with the high index enamel layer (c). Such transparent conductive layers that may be used as anodes for OLEDs are well known in the prior art. The most commonly used material is ITO (Indium Tin Oxide). The transparent conductive layer should have a light transmission of at least 80%, and a refractive index of between 1.7 and 2.2. Its total thickness is typically comprised between 50 and 200 nm.

As mentioned above the present invention is also drawn to two distinct methods for preparing the OLED substrate of the present invention.

The first method for preparing such an OLED substrate comprises the following successive steps:

(1) Providing a transparent flat substrate made of mineral glass having a refractive index $n_1$ of between 1.48 and 1.58;

(2) Dispersing mineral particles having a refractive index $n_3$ in a sol of at least one precursor of a mineral binder having a refractive index $n_2$ of between 1.45 and 1.61;

(3) Applying the resulting dispersion onto one side of the substrate in an amount to form a monolayer of mineral particles, (4) Drying and firing the resulting layer by heating resulting in a layer comprising a monolayer of mineral particles bonded to the substrate by means of a mineral binder having a refractive index $n_2$ of between 1.45 and 1.61, (5) Applying onto the monolayer of mineral particles a layer of high index glass frit having a refractive index $n_4$ of between 1.82 and 2.10, (6) Drying and fusing said glass frit so as to obtain a high index enamel layer having a refractive index $n_4$ comprised between 1.82 and 2.10 covering the monolayer of mineral particles;

the mineral particles being selected so as to have a refractive index $n_3$ comprised between $n_2+0.08$ and $n_4-0.08$.

This first method will be referred to hereafter as the "sol-gel method".

The flat glass substrates provided at step (1) generally have a thickness of between 0.1 and 5 mm, preferably of between 0.3 and 1.6 mm.

At step (2) the mineral particles as described earlier are suspended in a sol of at least one precursor of a mineral binder. Said precursor preferably is selected from the group consisting of sodium silicate, potassium silicate, lithium silicate, tetra-alcoxysilanes, preferably tetra-ethoxysilanes, titanium alcoxydes, aluminium alcoxydes, zirconium alcoxydes, or mixtures thereof.

Zirconium alcoxydes and titanium alcoxydes are used in admixture with other precursors in amounts low enough to not exceed the maximum refractive index (1.61) of the final mineral binder.

The resulting suspension is then applied, at step (3), onto one side of the flat substrate, by known methods such as for example dip coating, roll coating, spin coating, or slot coating.

The solvent of the sol phase is then evaporated and the dried layer is submitted to a firing step. The drying and firing at step (4) is advantageously carried out by heating at a temperature of at least 100° C., preferably of 100° C. to 300° C., more preferably of 110 to 200° C. When the mineral particles used are organo-modified particles carrying organic surface groups, such as alkylsilyl groups, the firing should be implemented at a temperature sufficiently high to effect thermal decomposition of these surface groups.

At step (5) a high index glass frit is then applied onto the baked layer comprising the mineral particles by any suitable method such as screen printing, spray coating, bar coating, roll coating, slot coating and spin coating, of an aqueous or organic suspension of said glass frit. A description of suitable high index glass frits and methods for coating and firing them can be found for example in EP 2 178 343.

The glass frit should be selected to have a melting point comprised between 450° C. and 570° C. and should lead to an enamel having a refractive index of 1.8 to 2.1.

Preferred glass frits have the following composition:
$Bi_2O_3$: 55-75 wt %
BaO: 0-20 wt %
ZnO: 0-20 wt %
$Al_2O_3$: 1-7 wt %
$SiO_2$: 5-15 wt %
$B_2O_3$: 5-20 wt %
$Na_2O$: 0.1-1 wt %
$CeO_2$: 0-0.1 wt %

In a typical embodiment, the glass frit particles (70-80 wt %) are mixed with 20-30 wt % of an organic vehicle (ethyl cellulose and organic solvent). The resulting frit paste is then applied onto the diffusive coated glass substrate by screen printing or slot coating. The resulting layer is dried by heating at a temperature of 120-200° C. The organic binder (ethyl cellulose) is burned out at a temperature of between 350-440° C., and the firing step resulting in the final enamel is carried out at a temperature of between 510° C. and 610° C., preferably between 520° C. and 600° C.

The resulting enamels have been shown to have a surface roughness with an arithmetical mean deviation $R_a$ (ISO 4287) of less than 3 nm when measured by AFM on an area of 10 μm×10 μm.

The amount of the high index glass frit coated onto the monolayer of mineral particles is generally comprised between 20 and 200 g/m$^2$, preferably between 25 and 150 g/m$^2$, more preferably between 30 and 100 g/m$^2$, and most preferably between 35 and 70 g/m$^2$.

The high index glass frit used in the present invention and the enamel resulting therefrom preferably are substantially devoid of solid scattering particles such as crystalline $SiO_2$ or $TiO_2$ particles. Such particles are commonly used as scattering elements in high index scattering layers but generally require an additional planarization layer, thereby increasing the total thickness of the high index coating.

The second method for preparing an OLED substrate according to the present invention will be referred to hereafter as the "fusion method". It differs from the "sol-gel method" described above only by the way of bonding the mineral particles to the glass substrate. This bonding is achieved not by gelifying a sol of precursors, but by fusing a glass frit.

The fusion method of the present invention comprises the following successive steps:

(1) Providing a transparent flat substrate made of mineral glass having a refractive index $n_1$ of between 1.48 and 1.58;

(2) Applying onto one side of said substrate a low index glass frit having a refractive index of between 1.45 and 1.61 in admixture with mineral particles having a refractive index $n_3$ and a glass transition temperature ($T_g$) or a fusion temperature at least 50° C. higher than the $T_g$ of the glass frit;

(3) Heating the resulting glass frit layer to a temperature allowing fusion of the glass frit without fusion of the mineral particles, resulting in a layer comprising a monolayer of mineral particles bonded to the substrate by means of a mineral binder having a refractive index $n_2$;

(4) Applying onto the monolayer of mineral particles a layer of a high index glass frit having a refractive index of between 1.82 and 2.10;

(5) Drying and fusing said high index glass frit so as to obtain a high index enamel having a refractive index $n_4$ comprised between 1.82 and 2.10 covering the monolayer of mineral particles, the mineral particles being selected so as to have a refractive index $n_3$ comprised between $n_2+0.08$ and $n_4-0.08$.

As for the sol-gel process, the flat glass substrates provided at step (1) advantageously have a thickness of between 0.1 and 5 mm, preferably of to between 0.3 and 1.6 mm.

At step (2) the glass frit particles and mineral particles are mixed and suspended in a conventional organic vehicle comprising an organic solvent and an organic polymer. The suspension is then applied according to known techniques such as screen printing or slot coating. The mineral particles may be amorphous, crystalline or semi-crystalline. They should not fuse or be substantially softened during the subsequent fusion step (4) of the glass frit. That's why the fusion point of the crystalline particles or the $T_g$ of the amorphous fraction of the particles must be significantly higher than the $T_g$ of the glass frit, i.e. at least 50° C., more preferably at least 100° C. higher than the $T_g$ of the glass frit.

Low index glass frits that may be used in the present invention for bonding the mineral particles to the glass substrates are well known in the art.

Preferred low index glass frits have the following composition:
$SiO_2$: 10-40 wt %
$Al_2O_3$: 1-7 wt %
$B_2O_3$: 20-50 wt %
$Na_2O+Li_2O+K_2O$: 5-30 wt %
ZnO: 3-35 wt %

At step (3) of the fusion method, the frit and particle-coated substrate is submitted to firing at a temperature sufficiently high to effect fusion of the glass frit. To obtain complete fusion of the glass frit and a sufficiently low viscosity, it is generally necessary to heat the substrate to a temperature at least 100° C. higher than the $T_g$ of the glass frit and to maintain this temperature for a duration of about 2 to 30 minutes.

In a typical embodiment, the glass frit and mineral particles (70-80 wt %) are mixed with 20-30 wt % of an organic vehicle (ethyl cellulose and organic solvent). The resulting paste is then applied onto the glass substrate for example by screen-printing or slot-coating. The resulting layer is dried by heating at a temperature of 120-200° C. The organic binder (ethyl cellulose) is burned out at a temperature of between 350-440° C., and the firing step resulting in the final enamel is carried out at a temperature of between 510° C. and 610° C., preferably between 520° C. and 600° C.

Steps (4) and (5) of the "fusion method" are identical to steps (5) and (6) of the "sol-gel method" described above.

The diffusive substrates planarized with high index enamel are particularly useful as substrates for bottom-emitting OLEDs. A transparent conductive layer has to be applied on top of the high index enamel before application of the stack of organic light emitting layers.

In a preferred embodiment, the method of the present invention therefore further comprise an additional step of coating the high index enamel with a transparent conductive layer, preferably a transparent conductive oxide such as ITO. Formation of such a TCL may be carried out according to conventional methods such as magnetron sputtering.

FIG. 3 is a schematic sectional view of an OLED substrate according to the present invention. Spheroidal alumina particles 3 having a refractive index $n_3$ of 1.76 are bonded by means of a low index binder 2 having a refractive index $n_2$ of 1.54, onto a glass substrate 1 having a refractive index of $n_1$ identical to $n_2$. The particles 3 are not embedded in the binder 2 and their upper parts protruding therefrom are in contact with the high index planarization layer 4 having a refractive index $n_4$ of 1.90. When the particles are not directly adjacent to each other they define a space where the high index layer 4 is directly in contact with the low index binder 2. The monolayer of particles defines two diffusive interfaces: the first diffusive interface $DI_1$ where the particles 3 are in contact with the high index planarization layer 4 and the second diffusive interface $DI_2$ where the particles 3 are in contact with the low index binder. A transparent conductive layer 5 is coated onto the high index planarization layer 4.

EXAMPLE 1

A low index frit (15 parts by weight) is mixed with $Al_2O_3$ particles (20 parts by weight) having an average equivalent diameter of 6 μm. The resulting powder is dispersed in 70 parts by weight of an organic medium using a 3-roll milling process.

The low index frit used has the following composition: 28.4 wt % of $SiO_2$; 3.6 wt % of $Al_2O_3$; 39.5 wt % of $B_2O_3$; 15.9 wt % of alkali oxides ($Na_2O$, $Li_2O$, $K_2O$); 12.6 wt % of ZnO. It has a refractive index of 1.54 and a $T_g$ of 484° C.

The resulting slurry is coated by screen-printing on a soda-lime glass substrate (0.7 mm) at a total dry weight of 13 g/m² and then submitted to drying at 150° C. The dried coating is fired at 600° C. for 20 minutes in an IR furnace.

The resulting substrate with the fired particle layer is then coated by screen-printing with a slurry of a high index frit (n=1.90).

The coating is then dried at 150° C. and fired for 10 minutes at 545° C. in an IR furnace.

EXAMPLE 2

20 g of alumina powder having an average diameter of 6 μm are dispersed in 150 g of 2-methoxy-propanol and dispersed by ultrasound. To this dispersion are added 30 g of Xenios® Surface Perfection (Evonik GmbH). The resulting dispersion is then applied by dip-coating onto a clean glass substrate and dried for about one minute at 120° C. The dried coated substrate is then heated at a rate of 5° C./minute to a temperature of 500° C. and fired for 5 minutes at this temperature.

The resulting layer is then coated by screen-printing with a slurry of a high index frit (n=1.90). The coating is dried at 150° C. and submitted to firing for 10 minutes at 545° C. in an IR furnace.

The invention claimed is:

1. A transparent diffusive OLED substrate comprising the following successive elements or layers :
   (a) a transparent flat substrate made of mineral glass having a refractive index $n_1$ of between 1.48 and 1.58,
   (b) a monolayer of mineral particles attached to one side of the substrate by means of a low index mineral binder having a refractive index $n_2$ of between 1.45 and 1.61, and
   (c) a high index layer made of an enamel having a refractive index $n_4$ comprised between 1.82 and 2.10 covering the monolayer of mineral particles, the mineral particles having a refractive index $n_3$ comprised between $n_2+0.08$ and $n_4-0.08$ and protruding from the low index mineral binder so as to be directly in contact with the high index layer, thereby forming a first diffusive interface between the mineral particles and the low index binder, and a second diffusive interface between the mineral particles and the high index layer.

2. The substrate according to claim 1, wherein the mineral particles have an average equivalent spherical diameter of between 0.3 μm and 10 μm.

3. The substrate according to claim 2, wherein the average equivalent spherical diameter is between 0.5 μm and 8 μm.

4. The substrate according to claim 1, wherein $n_1$ is comprised between 1.50 and 1.56 and $n_2$ is comprised between 1.47 and 1.59.

5. The substrate according to claim 1, wherein the mineral particles are essentially free of particles having an equivalent spherical diameter higher than 15 μm.

6. The substrate according to claim 1, wherein the refractive index of the high index layer is comprised between 1.85 and 2.05.

7. The substrate according to claim 6, wherein the refractive index of the high index layer is comprised between 1.90 and 2.00.

8. The substrate according to claim 1, wherein the thickness of the high index layer is comprised between 3 μm and 20 μm.

9. The substrate according to claim 8, wherein the thickness of the high index layer is comprised between 4 μm and 15 μm.

10. The substrate according to claim 1, wherein the mineral particles are alumina particles.

11. The substrate according to claim 1, wherein a roughness profile of the first and second diffusive interfaces has an arithmetical mean deviation $R_a$ comprised between 0.1 and 5 μm.

12. The substrate according to claim 11, wherein the arithmetical mean deviation $R_a$ is comprised between 0.2 and 4 μm.

13. The substrate according to claim 1 , wherein a volume ratio of the mineral particles to the low index mineral binder is comprised between 0.4 and 5.

14. The substrate according to claim 13, wherein the volume ratio of the mineral particles to the low index mineral binder is comprised between 0.6 and 4.

15. The substrate according to claim 1 further comprising a transparent electro-conductive layer on the high index enamel layer.

16. A method for preparing a transparent diffusive OLED substrate according to claim 1, comprising the following successive steps:
   (1) providing a transparent flat substrate made of mineral glass having a refractive index $n_1$ of between 1.48 and 1.58;
   (2) dispersing mineral particles having a refractive index $n_3$ in a sol of at least one precursor of a mineral binder having a refractive index $n_2$ of between 1.45 and 1.61;
   (3) applying the resulting dispersion onto one side of the substrate in an amount to form a monolayer of mineral particles,
   (4) drying and firing the resulting layer by heating resulting in a layer comprising a monolayer of mineral particles bonded to the substrate by means of a mineral binder having a refractive index $n_2$,
   (5) applying onto the monolayer of mineral particles a layer of high index glass frit having a refractive index $n_4$ of between 1.82 and 2.10, and
   (6) drying and fusing said glass frit so as to obtain a high index enamel layer having a refractive index $n_4$ comprised between 1.82 and 2.10 covering the monolayer of mineral particles;
      the mineral particles being selected so as to have a refractive index $n_3$ comprised between $n_2+0.08$ and $n_4-0.08$.

17. The method according to claim 16, wherein a weight ratio of the mineral particles to the dry matter of the sol is comprised between 0.5 and 8.

18. The method according to claim 16, wherein the at least one precursor of a mineral binder is selected from the group consisting of sodium, potassium or lithium silicate, tetraalcoxysilanes, titanium alkoxides, aluminium alcoxides, and zirconium alkoxides.

19. The method according to claim 18, wherein the drying and firing at step (4) is carried out by heating at a temperature of at least 100° C.

20. The method according to claim 19, wherein the drying and firing at step (4) is carried out by heating at a temperature from 100° C. to 300° C.

21. A method for preparing a transparent diffusive OLED substrate according to claim 1, comprising the following steps:
  (1) providing a transparent flat substrate made of mineral glass having a refractive index $n_1$ of between 1.48 and 1.58;
  (2) applying onto one side of said substrate a low index glass frit having a refractive index of between 1.45 and 1.61 in admixture with mineral particles having a refractive index $n_3$ and a glass transition temperature ($T_g$) or a fusion temperature at least 50° C. higher than the $T_g$ of the glass frit;
  (3) heating the resulting glass frit layer to a temperature allowing fusion of the glass frit without fusion of the mineral particles, resulting in a layer comprising a monolayer of mineral particles bonded to the substrate by means of a mineral binder having a refractive index $n_2$;
  (4) applying onto the monolayer of mineral particles a layer of a high index glass fit having a refractive index of between 1.82 and 2.10;
  (5) drying and fusing said high index glass frit so as to obtain a high index enamel having a refractive index $n_4$ comprised between 1.82 and 2.10 covering the monolayer of mineral particles,
    the mineral particles being selected so as to have a refractive index $n_3$ comprised between $n_2+0.08$ and $n_4-0.08$.

22. The method according to claim 21, wherein a weight ratio of the mineral particles to the low index glass frit is comprised between 0.5 and 8.

\* \* \* \* \*